United States Patent [19]

Korenstein et al.

[11] 4,290,843

[45] Sep. 22, 1981

[54] EPITAXIAL GROWTH OF MAGNETIC MEMORY FILM ON IMPLANTED SUBSTRATE

[75] Inventors: Ralph Korenstein, Plano; Carlos A. Castro, Garland, both of Tex.

[73] Assignee: Texas Instruments Incorporated, Dallas, Tex.

[21] Appl. No.: 122,550

[22] Filed: Feb. 19, 1980

[51] Int. Cl.$^3$ ............................................... B44C 1/22
[52] U.S. Cl. ................................... 156/628; 156/643; 156/655; 156/662
[58] Field of Search ............... 156/628, 643, 662, 612; 204/192 N; 427/43.1, 38, 39, 127–132, 48

[56] References Cited

U.S. PATENT DOCUMENTS 3,808,068  4/1974  Johnson ........................ 156/628 X
3,997,378  12/1976  Kaji et al. ...................... 156/612 X

*Primary Examiner*—Bernard D. Pianalto
*Attorney, Agent, or Firm*—Gary C. Honeycutt; Richard L. Donaldson; Mel Sharp

[57] ABSTRACT

A method for fabricating a magnetic memory film is disclosed wherein an epitaxial layer of magnetizable material is grown on the surface of a substrate which has been selectively implanted to damage portions of the crystalline surface. The resulting polycrystalline portion of the epitaxial layer grown on the damaged substrate surface is then selectively removed to leave the monocrystalline portions of the epitaxial layer.

9 Claims, 8 Drawing Figures

EPITAXIAL GROWTH OF MAGNETIC MEMORY FILM ON IMPLANTED SUBSTRATE

CROSS-REFERENCE TO RELATED APPLICATIONS

Related subject matter is contained in the following U.S. Patent Applications which have been filed simultaneously herewith and assigned to the Assignee of the present Application: Application Ser. No. 121,854, Feb. 14, 1980, entitled "Magnetic Domain Random Access Memory" and, Application Ser. No. 122,325, Feb. 19, 1980, entitled "Epitaxial Growth of Magnetic Memory Film in Substrate Recesses."

BACKGROUND OF THE INVENTION

1. Field of the Invention

The present invention relates generally to a method for fabricating a magnetic memory film and, more particularly, but not by way of limitation, to a method for fabricating a magnetic memory film wherein one surface of a crystalline substrate is selectively damaged to restrict monocrystalline growth to the non-damaged areas.

2. Prior Art Statement

Magnetic films have found use in magneto-optic memory systems. (See, "Magneto-Optic Memory Materials" in *Optica Acta*, 1977, Vol. 24, Pp. 482–494). Such films have also found use in display applications. (See, "Fast Switchable Magneto-Optic Memory-Display Components" by Hill and Schmidt, *Philips Journal of Research*, 1978, Vol. 33, Pp. 211–225; and "Thin-Film Iron-Garnet Display Components" by Hill and Schmidt in the *Digest of Technical Papers* presented at the 1979 SID International Symposium, First Edition, Pp. 80–81).

SUMMARY OF THE INVENTION

In the method of the present invention, one surface of a cyrstalline substrate is selectively damaged so that an epitaxial layer of magnetizable material grown on the surface will be polycrystalline over the damaged areas and monocrystalline elsewhere. The polycrystalline portions may then be selectively removed to leave the monocrystaline portions.

DESCRIPTION OF THE PREFERRED EMBODIMENT

Figure 1:
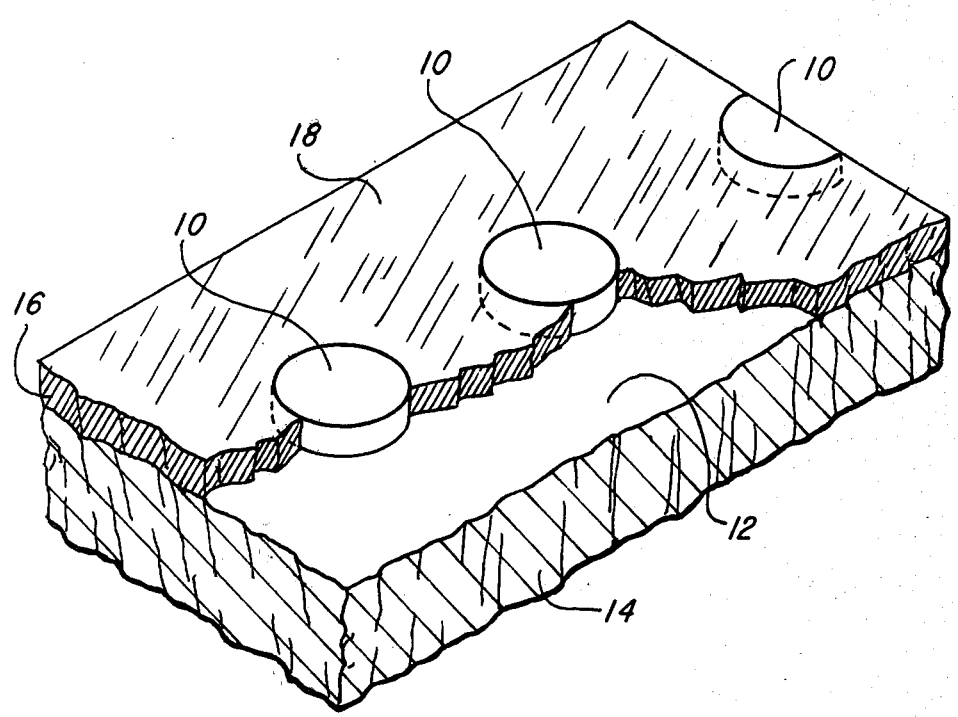
FIG. 1 is a partial perspective of several bodies of magnetic memory film fabricated on a substrate in accordance with the preferred form of the present invention.

Shown in FIG. 1 is a partial perspective view of several cells 10 of magnetic memory film fabricated on a main surface 12 of a crystalline substrate 14 in accordance with the preferred embodiment of the present invention. In the illustrated form, a suitable filler material 16 has been deposited upon the surface 12 of the substrate 14 generally between the cells 10 to form a substantially planar surface 18 coplanar with the upper surfaces of the cells 10.

Figure 2A:
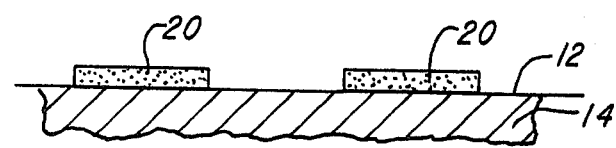
FIGS. 2a through 2g illustrate the processing sequence of the preferred form of the present invention.
Figure 2B:
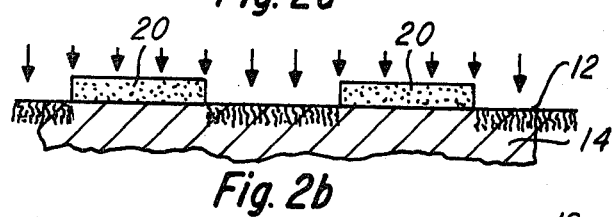
Figure 2C:
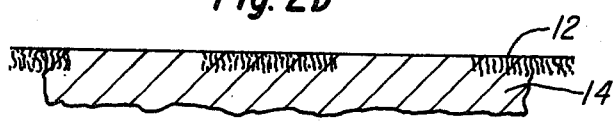
Figure 2D:
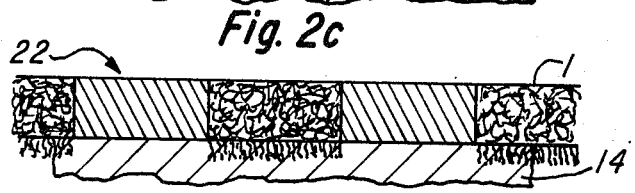
Figure 2E:
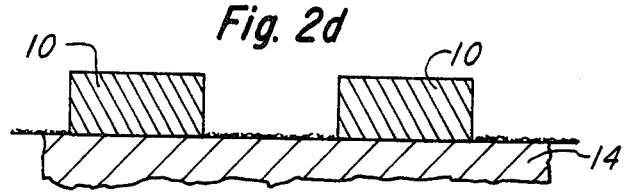

In the preferred method of the present invention, an ion mask of photoresist is deposited on the surface 12 of a suitable crystalline substrate 14, such as gadolinium gallium garnet ($Gd_3Ga_5O_{12}$), and patterned to leave isolated cells 20 of photoresist as shown in FIG. 2a. The surface 12 of the substrate 14 is then selectively damaged by ion implantation, at a typical implantation energy of 100 KeV and dosage of $8 \times 10^{14}$ Ne/cm$^2$, as shown in FIG. 2b. Following removal of the photoresist cells 20 as in FIG. 2c, an epitaxial layer 22 of magnetizable material, such as the magnetic garnet $(YSmLuCa)_3(GeFe)_5O_{12}$, is grown on the surface 12 to a desired thickness, typically 1 to 5 um, using conventional liquid phase epitaxial (LPE) techniques. As shown in FIG. 2d, the resultant epitaxial layer 22 will be polycrystalline in form over the damaged portions of the substrate 14 and monocrystalline elsewhere. Upon exposure to an etchant having a preferential poly etch rate, such as phosphoric acid at 174° C., for a brief period, typically 30 to 60 seconds, the polycrystalline portions will have been substantially removed from the surface 12, as shown in FIG. 2e. The remaining monocrystalline portions form the cells 10 shown in FIG. 1.

Figure 2F:
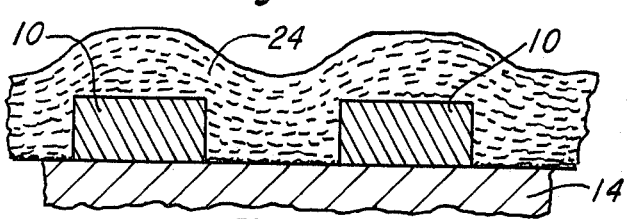
Figure 2G:
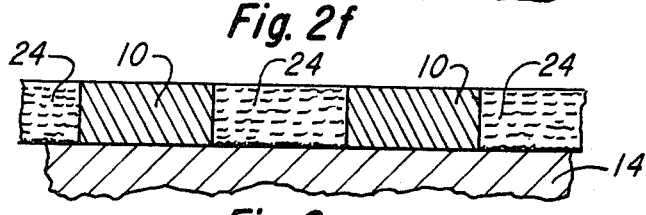

Although the structure shown in FIG. 2e may be suitable for some applications, it is often desirable in such applications as those described in the references cited above and in the copending U.S. Patent Application (TI-7880) to fill in the regions between the cells 10 to facilitate further processing steps. One preferred method for achieving the latter result is to deposit a layer 24 of a suitable filler material, such as $SiO_2$ or an organic resin, over the cells 10 and surface 12 of the substrate 14 as shown in FIG. 2f. The excess portions of the deposited material can then be easily removed by polishing to expose the upper surfaces of the cells 10, as shown in FIG. 2g.

Although the preferred method of the present invention has been described herein with reference to typical materials and processing parameters, such details have been given by way of example only. Thus, various changes may be made in the processing steps, materials and parameters of the preferred method as disclosed herein without departing from the spirit and scope of the present invention as defined in the claims appended hereto.

What is claimed is:

1. A method for fabricating a magnetic memory film comprising the steps of:
    depositing an ion mask on the surface of a crystalline substrate, and thereafter ion implanting said surface for the purpose of damaging the portion thereof exposed by the ion mask to the limited extent necessary to prevent monocrystalline growth upon said exposed portion;
    growing an epitaxial layer of magnetizable material having a similar crystalline structure on the surface of said substrate, the layer having a polycrystalline structure where grown over the ion damaged areas and monocrystalline structure elsewhere;
    selectively removing the polycrystalline portions of the epitaxial layer.

2. The method of claim 1 wherein the step of removing the polycrystalline portion of the epitaxial layer comprises exposing the epitaxial layer to an etchant having a preferential poly etch rate.

3. The method of claim 2 wherein the etchant is phosphoric acid.

4. The method of claim 1 further comprising the steps of:

depositing a layer of filler material over the surface of the substrate and the monocrystalline portions of the epitaxial layer; and removing substantially all of filler material above the upper surfaces of the monocrystalline portions of the epitaxial layer.

5. The method of claim 4 wherein the step of removing the filler material comprises polishing to expose the upper surfaces of the monocrystalline portions of the epitaxial layer.

6. The method for fabricating a magnetic memory film comprising the steps of:

depositing an ion mask on the surface of a gadolinium gallium garnet substrate, and thereafter ion implanting said surface for the purpose of damaging the portion thereof exposed by said mask to the limited extent necessary to prevent monocrystalline growth upon said exposed portions;

growing an epitaxial layer of magnetizable garnet on the surface of said substrate, said epitaxial layer having a polycrystalline structure where grown over the ion damaged areas and monocrystalline structure elsewhere;

selectively removing the polycrystalline portions of the epitaxial layer.

7. The method of claim 6 wherein the step of removing the polycrystalline portion of the epitaxial layer comprises exposing the epitaxial layer to an etchant having a preferential poly etch rate, such as phosphoric acid.

8. The method of claim 4 or 7 further comprising the steps of:

depositing a layer of filler material over the surface of the substrate and the monocrystalline portions of the epitaxial layer; and removing substantially all of the filler material above the upper surfaces of the monocrystalline portions of the epitaxial layer.

9. The method of claim 8 wherein the step of removing the filler material comprises polishing to expose the upper surfaces of the monocrystalline portions of the epitaxial layer.

* * * * *